United States Patent [19]

Bland et al.

[11] Patent Number: 5,068,764
[45] Date of Patent: Nov. 26, 1991

[54] ELECTRONIC DEVICE PACKAGE MOUNTING ASSEMBLY

[75] Inventors: Donald L. Bland, Fort Worth; Matthew C. Smithers, Lewisville, both of Tex.

[73] Assignee: Thermalloy Incorporated, Dallas, Tex.

[21] Appl. No.: 488,117

[22] Filed: Mar. 5, 1990

[51] Int. Cl.⁵ .............................................. H05K 7/20
[52] U.S. Cl. ..................................... 361/386; 357/79; 357/81; 361/388
[58] Field of Search ............................ 165/80.3, 185; 174/16.3; 357/79, 81; 361/386, 388–389

[56] References Cited

U.S. PATENT DOCUMENTS

| 3,519,889 | 8/1970 | Monaco | 361/388 |
| 4,408,220 | 10/1983 | Calabro | 174/16.3 |
| 4,552,206 | 11/1985 | Johnson et al. | 357/81 |

Primary Examiner—Gregory D. Thompson
Attorney, Agent, or Firm—Richards, Medlock & Andrews

[57] ABSTRACT

A unitary clip having a base portion and a stake end is used to attach an electronic device package to a heat sink. The stake end of the clip is secured within an aperture such as a groove or slot in the face of the heat sink and connected to the base by a curved spring portion. An electronic device package inserted between the base portion and the heat sink is urged into intimate contact with the surface of the heat sink.

15 Claims, 3 Drawing Sheets

ELECTRONIC DEVICE PACKAGE MOUNTING ASSEMBLY

FIELD OF THE INVENTION

This invention relates to mounting devices for securing electronic device packages to heat sinks. More particularly, it relates to mounting devices for adjustably and removeably securing electronic devices to heat sinks and the like without the use of loose hardware or bonding materials.

BACKGROUND OF THE INVENTION

Heat sinks are used in conjunction with electronic device packages to dissipate heat generated by the electronic device during use into the surrounding environment so that the electronic device will not be damaged or its performance affected by the heat. Conventional electronic device packages may include transistors, diodes, resistors and the like which are typically connected to a circuit through mounting on a printed circuit board. Generally, heat sinks are constructed of a material, usually a metal such as aluminum or aluminum alloys, having a high coefficient of thermal conduction which are formed into shapes adapted to convect or radiate heat at a high rate. In order for the heat sink to operate efficiently, it must be secured to and placed in good thermal contact with the electronic device package.

Various means are used to accomplish this purpose. For instance, it is known to provide an aperture in the electronic device package and to secure it to the heat sink by a screw, bolt or other mechanical means. However, this arrangement is somewhat time-consuming and expensive because it requires hand labor. It may also be desirable to periodically or temporarily remove the device package from the heat sink, such as if the electronic device package to which the heat sink is secured is being replaced or repaired. For this purpose heat sinks have been developed having resilient spring clips which frictionally engage the electronic device package yet allow the heat sink to be quickly and easily attached or removed from the electronic device package. Such clips may be integrally formed with the heat sink or may be constructed separately and then bonded to the heat sink.

As circuit assemblies become more complex, assembly becomes more time-consuming. Thus it is desirable that use of loose hardware be avoided as much as possible to reduce assembly time. It is also desirable that assembly devices such as clips for mounting device packages on circuit boards be readily adaptable for automated assembly and that such mounting devices be useful for a wide variety of packages on a wide variety of heat sinks.

Many heat sinks conventionally include a device-mounting clip which is either an integral part of, bonded to or bolted to the heat sink. Thus each heat sink and mounting clip comprises a single part which permits little flexibility in stocking requirements of circuit assemblers. A complete heat sink and clip assembly must be stocked for each device package used. Furthermore, placement of the device package on the heat sink is pre-determined by the position of the mounting clip, allowing no flexibility in locating the device package on the heat sink.

SUMMARY OF THE INVENTION

The present invention provides a mounting clip and mounting procedure for securing device packages to heat sinks in which the position of the mounting clip can be selected as desired and which is adaptable to a wide variety of heat sinks.

Briefly, the mounting assembly of this invention comprises a spring clip adapted to retain a device package adjacent the surface of any heat sink which has a suitable aperture or groove therein. The spring clip includes a support member in the form of a stake which may be inserted into the aperture or groove and, when mounted, resiliently urges the device package into contact with the heat sink. The stake is adapted to be removeably inserted by automated assembly equipment without the use of loose hardware or bonding procedures. Since the stake only requires a suitable aperture or groove for mounting, the location of the electronic device package on the heat sink can be varied as desired by suitable location of grooves or apertures on the heat sink. Thus any of a wide variety of heat sinks can be readily adapted to use the mounting clip of the invention and assembly time and costs are drastically reduced. These and other features and advantages of the invention will become more readily understood from the following detailed description taken in conjunction with the attached drawing in which:

DETAILED DESCRIPTION

Figure 1:
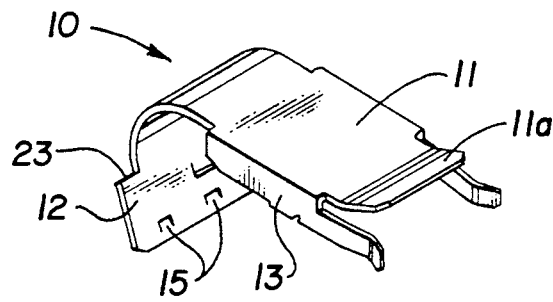
FIG. 1 is a perspective view of a preferred embodiment of a mounting clip for securing a device package to a heat sink in accordance with the invention.
Figure 2:
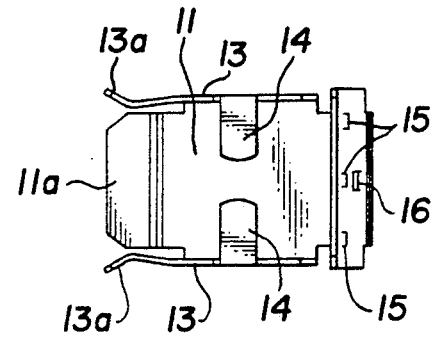
FIG. 2 is a bottom view of the clip of FIG. 1.
Figure 3:
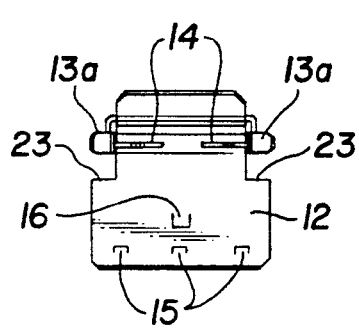
FIG. 3 is a front view of the clip of FIG. 1.
Figure 4:
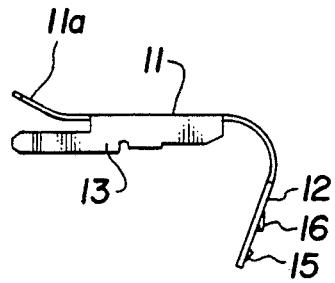
FIG. 4 is a side elevational view of the clip of FIG. 1.
Figure 5:
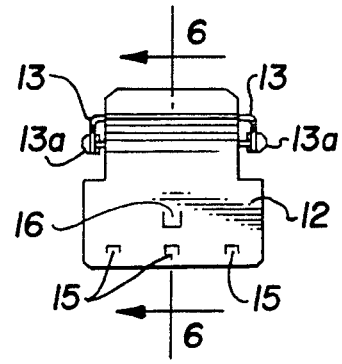
FIG. 5 is a rear view of the clip of FIG. 1.
Figure 6:
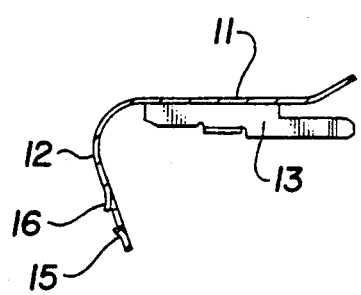
FIG. 6 is a cross-sectional view of the clip of FIG. 1 taken along line 6-6 of FIG. 5.
Figure 7:
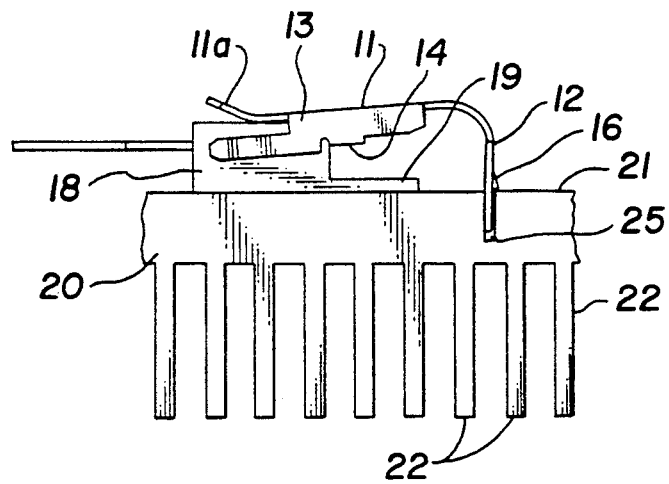
FIG. 7 is a side elevational view of an assembly of the clip of FIG. 1, a device package and a heat sink employing a mounting groove.
Figure 8:
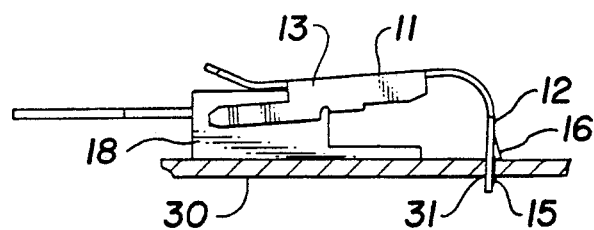
FIG. 8 is a side elevational view, partially in section, of an assembly of the clip of FIG. 1, a device package and a heat sink employing a mounting aperture.

A preferred embodiment of the invention is illustrated in FIGS. 1-6 and the assembly of the clip of FIGS. 1-6 with various heat sinks is illustrated in FIGS. 7 and 8. The mounting clip illustrated comprises a unitary body of resilient material such spring steel or the like which may be formed by conventional stamping and cutting processes. The clip 10 (FIGS. 1-8) comprises a substantially flat base member 11 and a support member or stake 12 extending from the base member at an angle of less than 90° from the plane of the surface of the base member. As will be explained in more detail hereinafter, the support member 12 is adapted for insertion into a groove or aperture in the heat sink as illustrated in FIGS. 7 and 8.

The clip 10 is configured to receive an electronic device package and, when assembled with a heat sink, holds the electronic device package in intimate contact with a surface of the heat sink. Accordingly, in the embodiment of FIGS. 1-8, the end 11a of base member or portion 11 is preferably curved upwardly from the plane of the flat base member 11 to permit the insertion of an electronic device package. In the embodiment illustrated in FIGS. 1-8, guide members 13 depend downwardly from the plane of the flat base member 11 on opposite lateral edges thereof and thus define a cavity for receiving the electronic device package. The ends 13a of guides 13 are also preferably curved outwardly to permit the ready insertion of an electronic device package within the cavity. Stop means 14 extends inwardly from the guides 13 within the cavity defined by the flat base portion 11 and guides 13 to provide means for accurately positioning the electronic device package within the cavity.

Figure 6A:
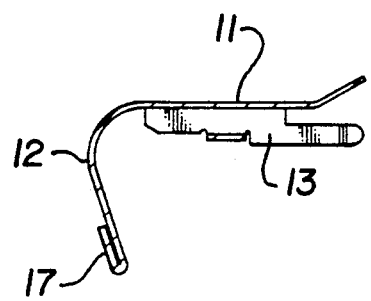
FIG. 6A is a sectional view of an alternative embodiment of the clip of FIG. 1.

In order to firmly secure the support member 12 within the aperture or groove of a heat sink, friction barbs are formed in the end of the support member. In the embodiment illustrated, three upwardly facing friction barbs 15 are aligned parallel with and slightly spaced from the end of support member 12. Friction barbs 15 may be formed by any suitable process such as stamping or the like to provide a free-ended barb, dimple or the like which forms a compressible friction fit within the groove. It will be readily recognized that an equivalent friction fit can be formed by folding the mounting stake to form an overlapped end 17 as illustrated in FIG. 6A or suitably crimping the end of the mounting stake 12. Any such deformation at or near the end of support member 12 will act to secure the clip within the groove.

One assembly of the clip of FIGS. 1-7 with a heat sink is illustrated in FIG. 7. The heat sink 20 of FIG. 7 comprises a body of thermally conductive material having substantially flat base 21 with fins 22 protecting from the opposite side thereof. A groove 25 is formed in the flat face 21 of the heat sink of sufficient width and depth to accept the support member 12. The clip 10 is secured to the heat sink 20 by simply forcing the end of support member 12 within the groove 25. Groove 25 is only slightly larger than the thickness of base member 12. Thus, barbs 25 are slightly compressed by the insertion of the end of member 12 within the groove, thus the clip 10 is securely attached to the heat sink 20.

It will be noted that when the clip 10 is secured to the heat sink 20 by insertion of the mounting stake 12 within the groove 25, flat base portion 11 will not be aligned parallel with base portion 21. Instead, since support member 12 extends from flat base member 11 at an angle of less than 90°, the flat base portion 11 will be aligned at an oblique angle with respect to base portion 21 with the curved end portion 11a approaching the base surface 21.

In FIG. 7 an electronic device package 18, such as a conventional TO-220 package having a thermal transfer pad 19 adjacent one face thereof and extending from one end thereof is affixed to the heat sink 20 in accordance with the invention. It will be observed that since support member 12 (prior to assembly) extends at an angle of less than 90° from the base portion 11, and since the end thereof is inserted into groove 25, the curved end portion 11a of flat base 11 is urged toward the base portion 21 of heat sink 20. When the electronic device package 18 is inserted between the flat base portion 11 and the surface 21 of heat sink 20, the curved portion of support member 12 is flexed to permit insertion of the device package 18. Since the clip 10 is made of resilient material, the clip 10 acts as a spring and the flat base portion 11 tends to urge the device package 18 toward and into intimate contact with the flat base portion 21 and thus rigidly secures the electronic device package in the desired position.

It will be observed that no loose hardware such as bolts, screws or the like is required to complete the assembly shown in FIG. 7. Instead, the support member 12 is simply forced into the groove 25 and retained therein by friction engagement between the barbs 15 and the walls of the groove. It will be readily appreciated that clip 10 can be withdrawn as desired by pulling support member 12 in the direction parallel with the axis of the groove 25. However, when device package 18 is inserted between flat base portion 11 and the base 21 of the heat sink, a twisting moment is applied to the interconnection between the groove and the support member 12, thus the support member 12 remains securely locked within the groove 25.

As seen in FIG. 8 the clip 10 may also be used in connection with a heat sink 30 which is comprised of a relatively thin sheet of metal or the like. Instead of having a groove as in the assembly of FIG. 8, the heat sink 30 of FIG. 8 has an aperture 31 which extends through the entire body of the heat sink 30. Aperture 31 could be, of course, a slot. While aperture 31 need only be as wide as the width of mounting member 12, it may be extended in length to permit relative lateral displacement of the clip 10 or permit insertion of multiple clips 10 aligned laterally in the slot as desired.

In addition to upwardly extending barbs 15, support member 12 includes at least one downwardly extending barb 16 spaced upwardly from upwardly directed barbs 15. The distance separating the barbs 15 from barbs 16 may, of course, be varied as desired. In the assembly of FIG. 7, the barb 16 is positioned to act as a stop which determines the maximum depth of insertion of the end of the mounting member 12 within the groove 25. Downwardly depending barb 16 serve the same function in the assembly of FIG. 8. However, depending on the thickness of the heat sink 30 of FIG. 8, the upwardly depending barbs 15 may be lodged within the aperture 30 or may be positioned so that they contact the undersurface of heat sink 30 and thus retain the support member 12 securely within the aperture 31. As in the embodiment of FIG. 7, the support member 12 will become securely locked within the aperture 31 when an electronic device package 18 is inserted between the heat sink 30 and the base member 11 of clip 10 by the torsional force exerted thereon.

Figure 9:
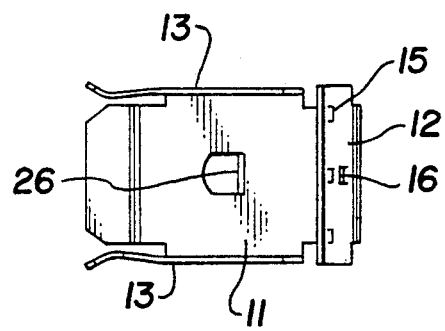
FIG. 9 is a bottom view of an alternate embodiment of a mounting clip for securing a device package to a heat sink in accordance with the invention.
Figure 10:
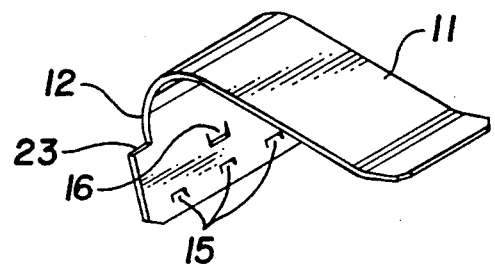
FIG. 10 is a perspective view of another alternate embodiment of a mounting clip for securing a device package to a heat sink in accordance with the invention.

While the embodiment described hereinabove is particularly suited to mounting a device package of the TO-220 type, it will be readily recognized that one main advantages of the invention is the versatility thereof. The size and shape of the clip 10 may be altered as desired to fit various other device packages and other means for maintaining the package in registry with the clip may be utilized. For example, as illustrated in FIG. 9, flap 26 is pierced from the flat base portion 11 of the clip at the appropriate position to form a stop for positioning the device package. Various other arrangements for providing stops and guides will be readily apparent to those skilled in the art. Furthermore, where precise registry of the electronic device package is not required, package guides and stops may be totally eliminated as shown in the embodiment of FIG. 10. The embodiment in FIG. 10 has no guides or stops and thus may be used in connection with a wide variety of sizes and shapes of electronic device packages. Furthermore, the guideless version of the clip shown in FIG. 10 is more readily adaptable for use in connection with insulating means positioned between the clip and electronic device package in which the insulating means includes guides for positioning the semiconductor device package. Various other modifications will be apparent to those skilled in the art.

Because of the simplicity of design and operation of the assembly disclosed herein, securing an electronic device package to a heat sink can be much more readily accomplished with automated equipment since no loose hardware or bonding procedures are required. Furthermore, as an aid to automated assembly the clip 10 is preferably provided with registry and insertion means suitable for use with automated equipment. In the preferred embodiment, the flat base portion 11 and the curved spring forming the interconnection between the base member 11 and the stake end of 12 of support member 12 are slightly narrower in lateral dimensions than the stake end of support member 12, thus forming a horizontally extending shoulder 23 on each side of a support member 12. The clip 10 may be conveniently inserted into grooves or apertures by exerting a downward force directly on the shoulders 23 by a suitable handling and insertion tool which may be readily automated.

From the foregoing it will be observed that the clip and mounting procedure of the invention may be used in connection with a wide variety of heat sinks. Virtually any heat sink body having a substantially flat surface can be modified to accept the clip described by forming a suitable opening, channel or groove therein. It is to be understood, therefore, that although the invention has been described with particular reference to specific embodiments thereof, the forms of the invention shown and described are to be taken as preferred embodiment of same and that various changes and modifications may be resorted to without departing from the spirit and scope of the invention as defined by the appended claims.

What is claimed:

1. Unitary mounting means for retaining an electronic device package in intimate contact with a heat sink comprising:
    (a) a substantially flat elongated base member having one free end and adapted to receive and support an electronic device package having oppositely disposed first and second major faces with the first major face disposed adjacent the substantially flat base member;
    (b) a support member extending from the other end of the base member at an angle of less than 90° from the plane of the surface of the base member; and
    (c) securing means comprising a deformation in the support member extending from the support member in a position which is beyond the plane of the second major face of such electronic device package and adapted to be received and secured within an opening in the surface of a heat sink disposed substantially parallel with and adjacent the second major face of the electronic device package.

2. Unitary mounting means as defined in claim 1 wherein said deformation comprises barbs extending from the support member.

3. Unitary mounting means as defined in claim 1 including guide means depending from said base member for aligning the electronic device package with respect to said mounting means.

4. Unitary mounting means as defined in claim 1 including stop means for determining position alignment of the electronic device package with respect to said mounting means.

5. Unitary mounting means as defined in claim 1 including a shoulder extending laterally from said support member.

6. Unitary mounting means for retaining an electronic device package in intimate contact with a heat sink comprising:
    (a) a substantially flat elongated base member having one free end and adapted to receive and support an electronic device package having oppositely disposed first and second major faces with the first major face disposed adjacent the substantially flat base member;
    (b) a support member extending from the other end of the base member at an angle of less than 90° from the plane of the surface of the base member; and
    (c) securing means comprising an overlapped end portion of the support member extending from the support member in a position which is beyond the plane of the second major face of such electronic device package and adapted to be received and secured within an opening in the surface of a heat sink disposed substantially parallel with and adjacent the second major face of the electronic device package.

7. Unitary mounting means as defined in claim 6 including guide means depending from said base member for aligning the electronic device package with respect to said mounting means.

8. Unitary mounting means as defined in claim 6 including stop means for determining position alignment of the electronic device package with respect to said mounting means.

9. Unitary mounting means as defined in claim 6 including a shoulder extending laterally from said support member.

10. The combination comprising:
    (a) a heat sink having a substantially flat face with an opening therein;
    (b) an electronic device package having a first major face and a second oppositely disposed major face; and
    (c) unitary mounting means securing said electronic device package in intimate contact with said heat sink comprising an elongated base portion having one free end and a support portion interconnected by a curved spring portion to the opposite end, said support portion secured within said opening in said heat sink and said base portion positioned against said second major face of said electronic device package and urging said first major face of said electronic device package into intimate contact with said heat sink.

11. The combination set forth in claim 10 wherein said base portion includes guide means for aligning said electronic device package with respect to said mounting means.

12. The combination set forth in claim 10 including stop means for determining position alignment of said electronic device package with respect to said mounting means.

13. The combination set forth in claim 10 wherein said aperture is a groove in the surface of said heat sink.

14. The combination set forth in claim 10 wherein said aperture is a slot extending through said heat sink.

15. The combination set forth in claim 10 wherein said support portion includes laterally extending shoulders.

* * * * *

UNITED STATES PATENT AND TRADEMARK OFFICE
CERTIFICATE OF CORRECTION

PATENT NO. : 5,068,764

DATED : November 26, 1991

INVENTOR(S) : Donald L. Bland and Matthew C. Smithers

It is certified that error appears in the above-identified patent and that said Letters Patent is hereby corrected as shown below:

Column 4, line 44, change "barb" to ---barbs---

Column 7, line 6, change "aperture" to ---opening---

Column 8, line 2, change "aperture" to ---opening---

Signed and Sealed this

Fourth Day of May, 1993

*Attest:*

MICHAEL K. KIRK

*Attesting Officer*   *Acting Commissioner of Patents and Trademarks*